US012672545B2

(12) United States Patent
Uchida

(10) Patent No.: US 12,672,545 B2
(45) Date of Patent: Jun. 30, 2026

(54) APPARATUSES AND METHODS INCLUDING STRUCTURES IN SCRIBE REGIONS OF SEMICONDUCTOR DEVICES

(71) Applicant: Micron Technology, Inc., Boise, ID (US)

(72) Inventor: Fumie Uchida, Kyoto (JP)

(73) Assignee: Micron Technology, Inc., Boise, ID (US)

( * ) Notice: Subject to any disclaimer, the term of this patent is extended or adjusted under 35 U.S.C. 154(b) by 726 days.

(21) Appl. No.: 17/930,353

(22) Filed: Sep. 7, 2022

(65) Prior Publication Data

US 2024/0079347 A1      Mar. 7, 2024

(51) Int. Cl.
| | |
|---|---|
| *H01L 23/00* | (2006.01) |
| *B23K 26/40* | (2014.01) |
| *H10W 20/41* | (2026.01) |
| *H10W 20/42* | (2026.01) |
| *H10W 42/00* | (2026.01) |
| *B23K 101/40* | (2006.01) |

(52) U.S. Cl.
CPC .......... *H10W 42/121* (2026.01); *B23K 26/40* (2013.01); *H10W 20/42* (2026.01); *H10W 20/425* (2026.01); *H10W 20/435* (2026.01); *B23K 2101/40* (2018.08)

(58) Field of Classification Search
CPC ............... H01L 23/562; H01L 23/5226; H01L 23/5283; H01L 23/53238; H01L 21/78; H01L 21/6836; H01L 2221/68336; B23K 26/40; B23K 2101/40; B23K 26/0622; B23K 26/364; B23K 26/53; B23K 26/70
See application file for complete search history.

(56) References Cited

U.S. PATENT DOCUMENTS

| | | | |
|---|---|---|---|
| 11,810,822 B2 | 11/2023 | Sugioka et al. | |
| 2005/0110120 A1* | 5/2005 | Wang | H01L 23/585 257/622 |
| 2010/0025824 A1* | 2/2010 | Chen | H01L 21/78 257/E21.214 |
| 2013/0299828 A1* | 11/2013 | Bahierathan | H01L 22/34 257/48 |
| 2015/0325531 A1* | 11/2015 | Dyer | H01L 23/481 257/620 |
| 2016/0260674 A1* | 9/2016 | Jones | H01L 21/76898 |

* cited by examiner

*Primary Examiner* — Karen Kusumakar
(74) *Attorney, Agent, or Firm* — Dorsey & Whitney LLP

(57) ABSTRACT

An apparatus includes a scribe region between a first die and a second die adjacent to each other in a first direction, the scribe region including a first crack stop region and a second crack stop region extending in a second direction that is perpendicular to the first direction, wherein the first and second dies are to be separated along a scribe line between the first and second crack stop regions, and a first structure in each of the first and second crack stop regions, the first structure including a plurality of first metal lines arranged in a hexagonal array in a plane defined by the first and second directions.

13 Claims, 6 Drawing Sheets

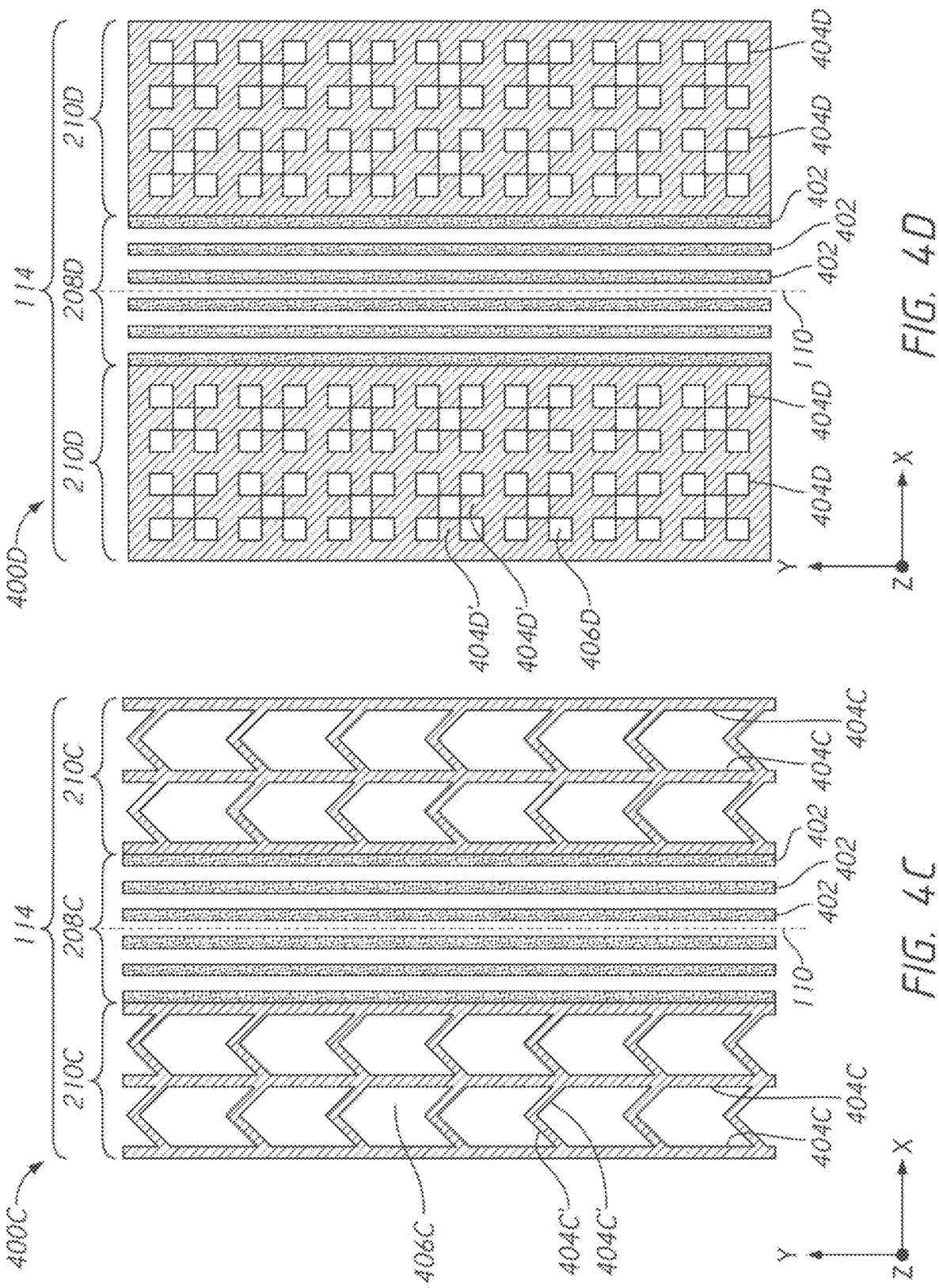

APPARATUSES AND METHODS INCLUDING STRUCTURES IN SCRIBE REGIONS OF SEMICONDUCTOR DEVICES

BACKGROUND

Semiconductor device manufacturers face challenges in fabricating semiconductor devices as the devices continue to reduce sizes and increase complexity. For example, wafers having semiconductor devices formed thereon are diced into individual dies, and thus a wafer dicing plays a critical role in the quality of the final products. Wafer dicing is conventionally performed by blade dicing or laser dicing. Edges of singulated dies are rough and subject to chipping, which may cause cracks that can propagate to the devices, resulting in a lower yield of the devices.

Therefore, a scribe region along which dies are separated that can mitigate crack propagation may be desirable.

BRIEF DESCRIPTION OF THE DRAWINGS

FIG. 4C is a plan view of a portion of a semiconductor structure, in accordance with an embodiment of the present disclosure.

FIG. 4D is a plan view of a portion of a semiconductor structure, in accordance with an embodiment of the present disclosure.

Figure 1:
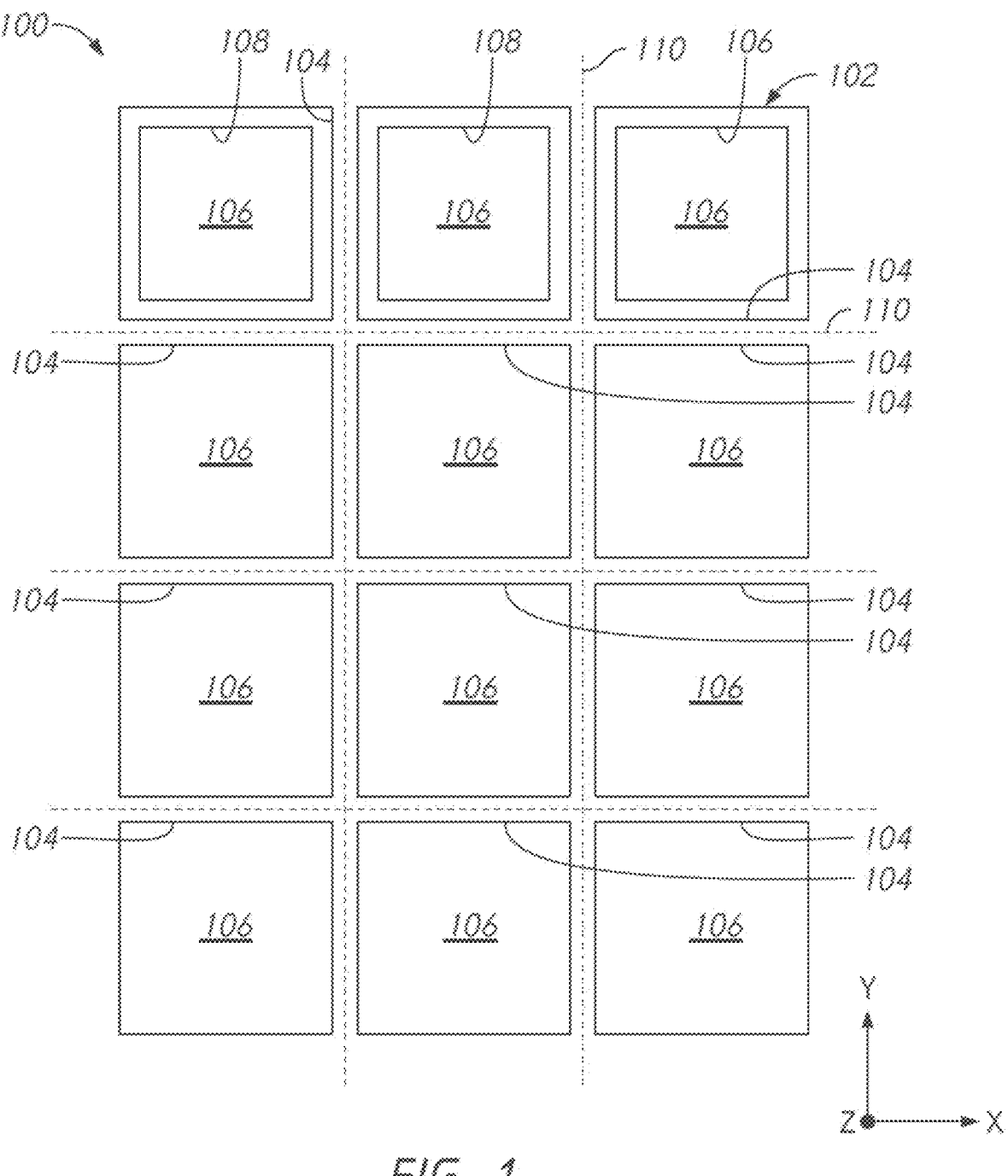
FIG. 1 is a plan view of a semiconductor structure having semiconductor dies in accordance with an embodiment of the present disclosure.

To facilitate understanding, identical reference numerals have been used, where possible, to designate identical elements that are common to the figures. In the figures and the following description, an orthogonal coordinate system including an X-axis, a Y-axis, and a Z-axis is used. The directions represented by the arrows in the drawing are assumed to be positive directions for convenience. It is contemplated that elements disclosed in some embodiments may be beneficially utilized on other implementations without specific recitation.

DETAILED DESCRIPTION

Various embodiments of the present disclosure will be explained below in detail with reference to the accompanying drawings. The following detailed description refers to the accompanying drawings that show, by way of illustration, specific aspects in which embodiments of the present disclosure may be practiced. These embodiments are described in sufficient detail to enable those skilled in the art to practice the embodiments of present disclosure. Other embodiments may be utilized, and structure, logical and electrical changes may be made without departing from the scope of the present disclosure. The various embodiments disclosed herein are not necessary mutually exclusive, as some disclosed embodiments can be combined with one or more other disclosed embodiments to form new embodiments.

FIG. 1 is a plan view of a semiconductor structure 100 having semiconductor dies (referred to simply as "dies" hereinafter) 102 in accordance with an embodiment of the present disclosure. Each die 102 having edges 104 may include a circuit region 106 having and circuit edges 108 around the circuit region 106. In some embodiments, the circuit regions 106 may be disposed in a matrix and each circuit region 106 may have a rectangular shape. In each circuit region 106, transistors and circuit components, including conductive interconnects may be disposed. The transistors and the circuit components may include memory cells, one or more circuits that provide memory access functions, such as read operations and write operations to the memory cells, and a control circuit that controls the circuits.

The semiconductor structure 100 may be separated into individual dies 102 along scribe lines 110. Between adjacent dies 102, metal lines and vias are formed within the semiconductor structure 100 (e.g., between about 10 μm and about 100 μm from a top surface of the semiconductor structure 100) along the scribe line 110. The metal lines and vias assist separating the semiconductor structure 100 into individual dies 102 along the scribe line 110 by dicing.

In some embodiments, separation of dies 102 is performed by blade dicing or laser dicing (e.g., a laser ablation or a stealth dicing), which pulverizes a wafer material in the cutting path (known as dicing street or kerf). In a laser ablation, irradiation of laser pulses along a scribe line alone cuts a thin wafer. In a stealth dicing, irradiation of laser pulses perforates a sub-surface of a wafer along a scribe line, and dies are separated by a tape expansion along the scribe line. A laser dicing typically allows a reduced kerf width as compared to a blade dicing. However, edges of singulated dies are rough and chipping of an upper portion of the circuit edges 108 may occur. A chip from the circuit edges 108 may propagate as a crack to the circuit region 106 during a dicing process. This propagation of a crack may be caused by heat and vibrations due to laser stealth and vibrations due to grinding. Furthermore, in a laser stealth dicing, tensile stress is caused by a tape expansion in various directions from the center of the wafer to the edges of the wafer, further causing propagation of a crack in the wafer.

In embodiments described herein, a crack top structure is included in the vicinity of the edges 104 of each die 102 to (i) reduce heat and vibrations due to laser stealth, and (ii) cushion (e.g., mitigate) tensile stress caused by tape expansion.

Figure 2:
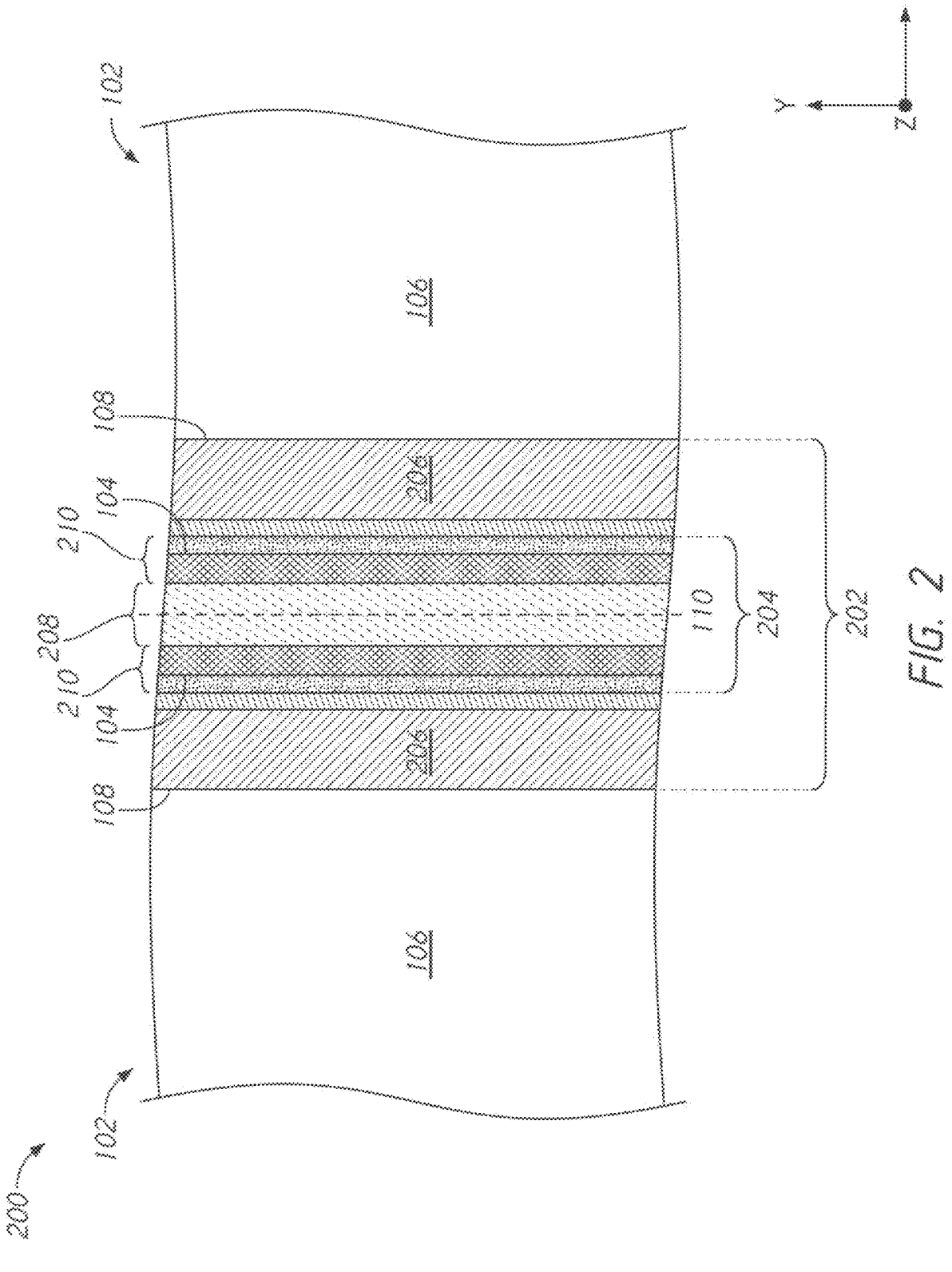
FIG. 2 is a plan view of a portion of a semiconductor structure in accordance with an embodiment of the present disclosure.

FIG. 2 is a plan view of a portion 200 of the semiconductor structure 100, including two dies 102 adjacent to each other in the X direction, in accordance with an embodiment of the present disclosure. As shown, the semiconductor structure further includes a scribe region 202 around each circuit region 104 and a scribe center region 204 at the center of the scribe region 202. The scribe line 110 is defined within the scribe center region 204. The scribe region 202 may include pad regions 206 of the dies 102. The pad regions 206 may include test circuits and test terminals. The scribe center region 204 may include a crack assist region 208 extending in the Y direction at the center of the scribe center region 204. The crack assist region 208 includes a crack assist structure. Excessive force due to dicing may be guided along the crack assist region 208, away from the dies 102. In some examples, the crack assist region 208 may have a width, which is greater than a width of a laser beam used in a stealth laser dicing. In some examples, the crack assist region 208 may have a width between 0.5 ums-15 ums, inclusive. In some examples, the width of the laser beam may be 0.1 um, or within 10% of 0.1 um. The crack assist structure in the crack assist region 208 may collapse to absorb excessive force due to dicing.

The scribe center region 204 may also include crack stop regions 210 that are on both sides of the crack assist region 208. In some examples, the crack stop regions 210 may be 1-10 ums. Each of the crack stop regions 210 includes a crack assist structure. The crack stop structures in the crack stop regions 210 may help prevent excessive force caused by dicing from propagating to the dies 102 and generating cracks that reach the dies 102. The crack stop structures in the crack stop regions 210 may be disposed outside the pad regions 206, and apart from the test terminals in the pad regions 206.

Figure 3A:
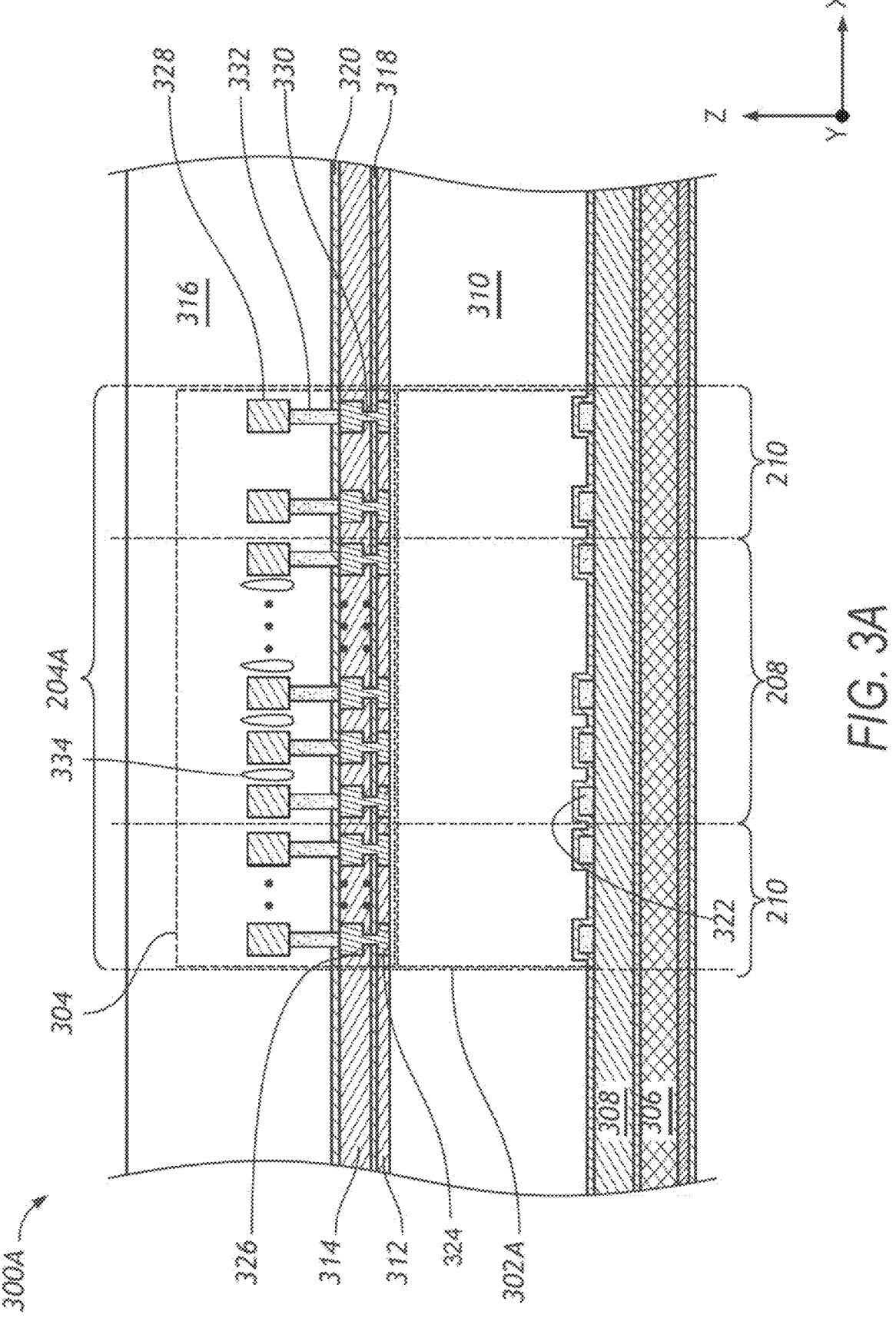
FIG. 3A is a cross-sectional view of a portion of a semiconductor structure, in accordance with an embodiment of the present disclosure.

FIG. 3A is a cross-sectional view of a portion 300A of the semiconductor structure 100, including a scribe center region 204A, in accordance with an embodiment of the present disclosure. The scribe center region 204A may be the scribe center region 204 depicted in FIG. 2.

The scribe center region 204A includes one or more structures (e.g., a crack assist structure in the crack assist crack assist region 208 and/or crack stop structures in the crack stop regions 210 of FIG. 2). The one or more structures may include a front-end-of-line (FEOL) structure 302A in a FEOL of the semiconductor structure 100, and a back-end-of-line (BEOL) structure 304 in a BEOL of the semiconductor structure 100.

The FEOL of the semiconductor structure 100 may include, for example, memory cells (not shown) on a substrate 306 in a circuit region (e.g., circuit region 106 of FIG. 1), an insulating film 308 on the substrate 306, and an insulating film 310 on the insulating film 308. The insulating films 308 and 310 may include dielectric material, for example, silicon dioxide ($SiO_2$). The substrate 306 may be a silicon based material or any suitable insulating materials or conductive materials as needed. The substrate 306 may include a material such as crystalline silicon (e.g., Si (100), Si (110), or Si (111), silicon oxide, strained silicon, silicon germanium, doped or undoped polysilicon, doped or undoped silicon wafers and patterned or non-patterned wafers, silicon on insulator (SOI), carbon doped silicon oxides, silicon nitride, doped silicon, germanium, gallium arsenide, glass, or sapphire. The substrate 306 may have various dimensions, such as 200 mm, 300 mm, 450 mm or other diameter wafers, as well as, rectangular or square panels. Unless otherwise noted, implementations and examples described herein are conducted on substrates with a 200 mm diameter, a 300 mm diameter, or a 450 mm diameter substrate.

The BEOL of the semiconductor structure 100 may include, for example, insulating films 312, 314, and 316 on the insulating film 310. The BEOL may further include a barrier film 318 between the insulating film 312 and the insulating film 314, and a barrier film 320 between the insulating film 314 and the insulating film 316, to prevent diffusion of conductive material such as copper (Cu). The insulating film 316 may include dielectric material, for example, silicon dioxide ($SiO_2$). The insulating films 312 and 314 may include material having a lower dielectric constant (k) (low-k material) than silicon dioxide ($SiO_2$). The low-k material may be included to prevent diffusion of a conductive material, such as copper (Cu), and to reduce parasitic capacitance between interconnects. Using the low-k material may help to achieve high-speed operations of electronic circuits in the dies 102. Examples of the low-k material may include silicon oxycarbide (SiOC), porous SiOC or silicon carbonitride (SiCN). The barrier films 318, 320 may include transition metal, such as yttrium (Y), titanium (Ti), zirconium (Zr), hafnium (Hf), niobium (Nb), or tantalum (Ta). In some embodiments, the one or more barrier films may include transition metal, such as, yttrium (Y), titanium (Ti), zirconium (Zr), hafnium (Hf), niobium (Nb), or tantalum (Ta), or the nitride thereof. The barrier films 318, 320 may include barrier low-k (BLOk) films. The BLOk films may include low-k material, such as nitrogen-doped silicon carbide (SiCN). The barrier films 318, 320 may include silicon nitride ($Si_2N_3$) that may improve adherence of the conductive material.

Figure 3B:
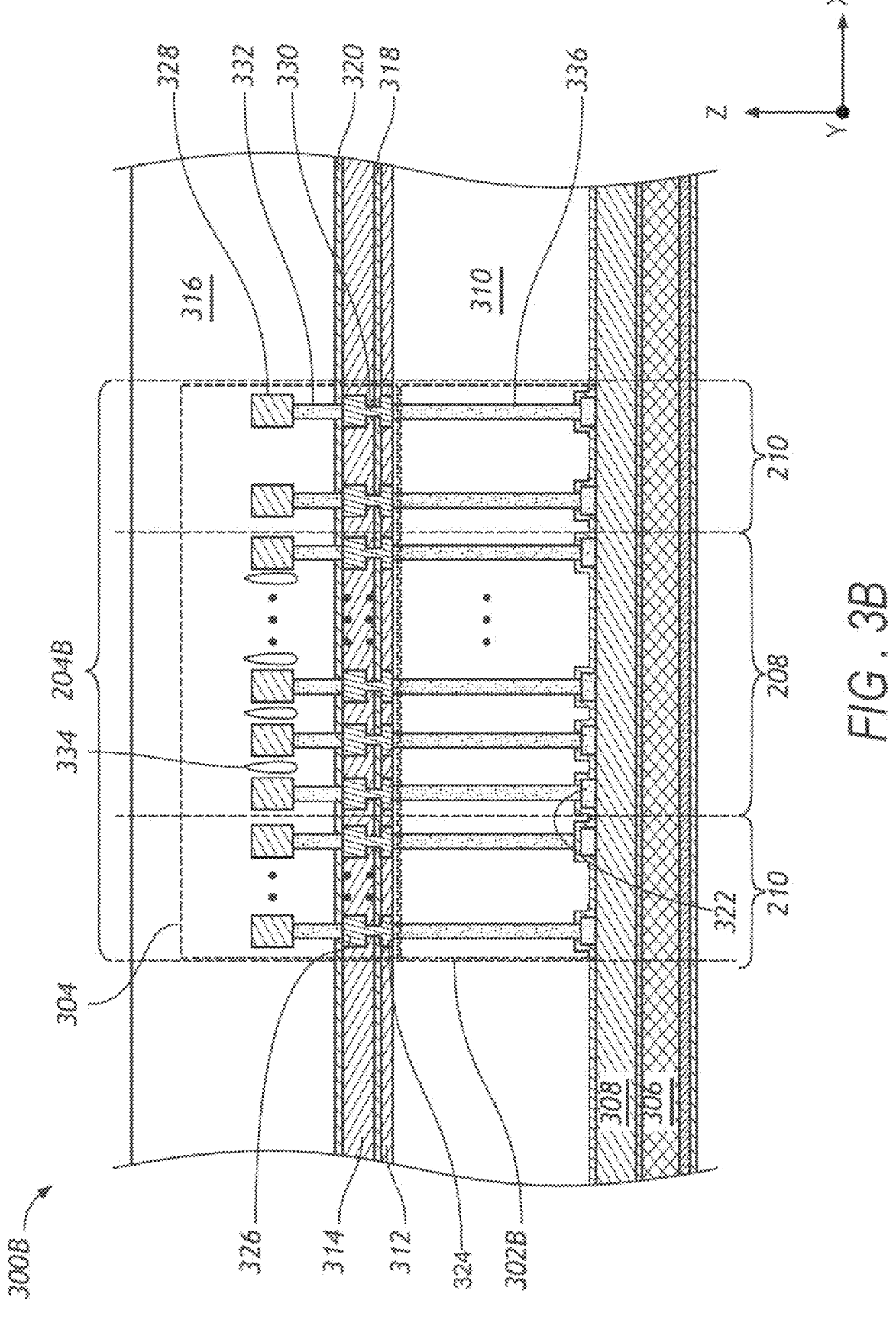
FIG. 3B is a cross-sectional view of a portion of a semiconductor structure, in accordance with an embodiment of the present disclosure.

While the BEOL structure 304 in FIGS. 3A and 3B includes the insulating films 312, 314, and 316, it will be appreciated that a number of insulating films and the location of the insulating films included in the BEOL structure 304 may not be limited to the insulating films 312, 314, and 316 previously described.

The FEOL structure 302 includes metal lines 322 encapsulated within the insulating film 310 on the insulating film 308. The BEOL structure 304 includes metal lines 324 encapsulated within the insulating film 312, metal lines 326 encapsulated within the insulating film 314, and metal lines 328 encapsulated within the insulating film 316. The metal lines 322, 324, 326, and 328 each extend in the XY plane. The BEOL structure 304 may further include vias 330 encapsulated within the insulating film 314, and vias 332 encapsulated within the insulating film 316. Each via 330 may have one end adjoining a metal line 324 and another end adjoining a metal line 326. Each via 332 may have one end adjoin a metal line 326 and another end adjoin a metal line 328. The vias 330 and 332 are arranged in the XY plane and each extends in the Z direction. It should be noted that the number of metal lines and the location of metal lines may not be limited to the metal lines 324, 326, 328 shown in FIGS. 3A and 3B. In some embodiments, the metal lines 324 are formed by a single-Damascene process, in which an insulating film is deposited, then patterned, and subsequently filled with metal. The vias 330 and the metal lines 326 are formed by a dual-Damascene process, in which vias and trenches are patterned such that metal can filled in both simultaneously. In some embodiments, the metal lines 324 and 326 and the vias 330 may include the same material. In some embodiments, the metal lines 324 and 326 and the vias 330 may include material that has hardness greater than hardness of material included in the insulating films 312, 314, and 316. For example, the metal lines 324 and 326 may include copper (Cu). The metal lines 328 may include aluminum (Al). In some embodiments, the vias 332 may include tungsten (W).

In some embodiments, voids 334 may be optionally disposed between adjacent metal lines 328. The voids 334 may prevent excessive force caused by dicing from propagating towards the dies 102 and generating cracks that reach the dies 102.

FIG. 3B is a cross-sectional view of a portion 300B of the semiconductor structure 100, including a scribe center region 204B in accordance with an embodiment of the present disclosure. The scribe center region 204B may be the scribe center region 204 depicted in FIG. 2. The portion 300B is similar to the portion 300A of FIG. 3A. However, the portion 300B has a configuration in which the scribe center region 204B additionally includes one or more vias in the FEOL, which will be described in more detail below. The same reference numerals are used for the components that are substantially the same as those of the portion 300A, and the description of repeated components may be omitted.

The scribe center region 204B in the portion 300B may include a FEOL structure 302B in the FEOL and the BEOL structure 304 in the BEOL. The FOEL structure 302B may additionally include one or more vias 336 disposed in the insulating film 310. Each via 336 may have one end on a metal line 322 and another end on a metal line 324. In some embodiments, the vias 336 may include material that has hardness greater than the hardness of material included in the insulating film 310. In some embodiments, the vias 336 may include tungsten (W).

Figures 4A, 4B:
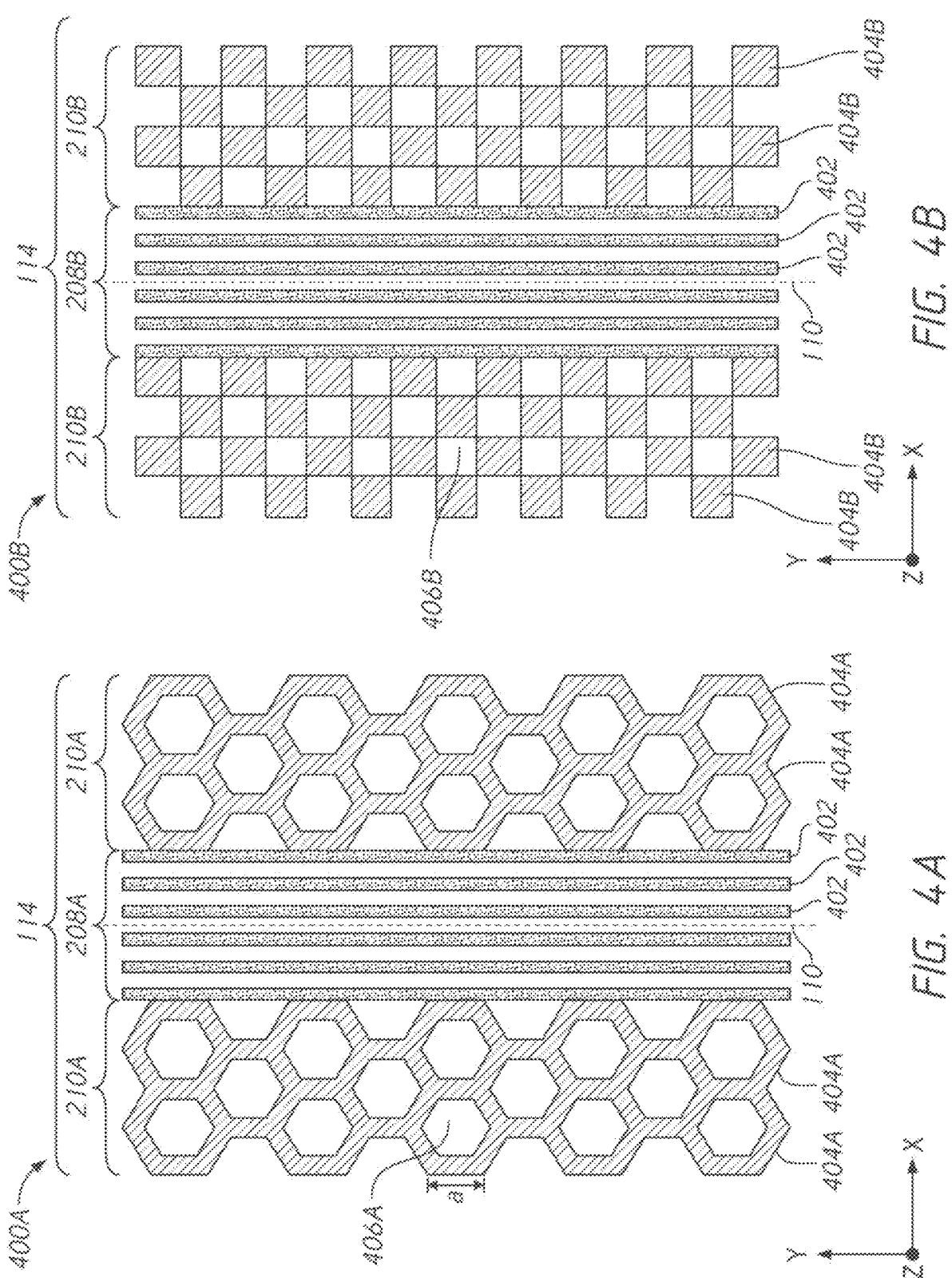
FIG. 4A is a plan view of a portion of a semiconductor structure, in accordance with an embodiment of the present disclosure.
FIG. 4B is a plan view of a portion of a semiconductor structure, in accordance with an embodiment of the present disclosure.

FIG. 4A is a plan view of a portion 400A of the semi-conductor structure 100, including a crack assist region 208A and crack stop regions 210A in the scribe center region 204 extending in the Y direction, in accordance with an embodiment of the present disclosure. The crack assist region 208A may be the crack assist region 208 depicted in FIG. 2. The crack stop regions 210A may be the crack stop regions 210 depicted in FIG. 2. The crack assist region 208A may include a crack assist structure that includes metal lines 402, and the crack stop regions 210A may include crack stop structures that include metal lines 404A. The metal lines 402 and 404A can be any of the metal lines 324, 326, 328, any of the vias 330, 332, 336, or any combination thereof. The metal lines 402 and 404A include material that has hardness greater than a hardness of an insulating film including the structures in the crack assist region 208A and the crack stop regions 210A. For example, the crack stop region 210A may be filled with the insulating film 406A.

The metal lines 402 in the crack assist region 208A extend parallel to the scribe line 110 in the Y direction. The metal lines 402 may be between about 10 μm and about 100 μm from a top surface of the semiconductor structure 100 along the scribe line 110. The crack assist structure in the crack assist region 208A including the metal lines 402 in the crack assist region 208A may guide excessive force due to dicing to propagate along the metal lines 402 in the scribe center region 204, away from the dies (e.g., the dies 102 depicted in FIG. 1). The crack assist region 208A may have a width greater than a width of a laser beam used in stealth laser dicing. For example, the crack assist region 208A may a 0.5-15 ums width, which is greater than a 0.1 um width of a laser beam used in a steal laser dicing. During dicing, the crack assist structure in the crack assist region 208A may collapse to absorb excessive force due to dicing.

The metal lines 404A in the crack stop regions 210A are arranged in a hexagonal array in the XY plane. The metal lines 404A may each include metal lines 326 and 328, a via 332 connecting the metal lines 326 and 328. This configu-ration of the metal lines may reduce kerf width due to suppression of vibrations of a region between a surface and a sub-surface of a wafer in the vicinity of the scribe line 110 during irradiation of laser pulses in a stealth dicing, for example, by between about 1 μm and about 2 μm. In some examples, this may be a reduction in kerf width of approxi-mately 50%. Conventionally, kerf width is about 20 μm, and extends in the crack assist region 208 and the crack stop regions 210 having conventional configuration of the metal lines.

Furthermore, due to the hexagonal arrangement of the metal lines 404A, the tensor stress caused by a tape expan-sion in a stealth dicing can be mitigated along the metal lines 404A in the directions perpendicular (X direction) to and parallel (Y direction) to the scribe line 110 and in the directions that are ±60 degrees off the scribe line 110. These directions coincide with crystallographic orientations on preferred cleavage planes (110) and (111) of single crystal-line silicon. Thus, the tensor stress that may be induced in the crystallographic orientations during a cleavage can be effectively mitigated. In some implementations, the sub-strate 306 is a 300 mm Si (110) wafer, and cleavage occurs dominantly in the (110) plane, but also in the (111) plane. Thus, the metal lines 404A of the configuration described herein mitigate cleavages in both (110) and (111) planes. In some embodiments, each hexagon is between 0.1-5 um, inclusive. In some embodiments, each hexagon encloses integer multiples of unit cells of silicon (111) (which may have a lattice spacing of 3.14 Å in some embodiments) or (110) (which may have a lattice spacing of 3.84 Å in some embodiments) crystallographic planes. For example, a hexa-gon has a unit cell length a of between about 0.1 μm and about 3 μm (e.g., 30-10000 times the silicon (111) unit cell length in some examples) or between about 0.1 μm and about 3 μm (e.g., 30-10000 times the silicon (110) unit cell length in some examples). In some embodiments, there may 1-100 hexagons. In some implementations, the crack stop regions 210A have a width of between about 0.5 μm and about 50 μm.

It should be noted that the number of the metal lines 402 in the crack assist structure in the crack assist region 208A is not limited to the number shown in FIG. 4A. The number of the metal lines 402 may be less or more than the number shown in FIG. 4A. In some embodiments, the crack assist region 208 does not include a crack assist structure.

FIG. 4B is a plan view of a portion 400B of the semi-conductor structure 100, including a crack assist region 208B and crack stop regions 210B in the scribe center region 204 extending in the Y direction, in accordance with an embodiment of the present disclosure. The crack assist region 208B may be the same as the crack assist region 208A depicted in FIG. 4A, and may be the crack assist region 208 depicted in FIG. 2. In FIG. 4B, a configuration in which the crack stop regions 210B include metal lines 404B that are arranged differently from the metal lines 404A depicted in FIG. 4A, will be described. The same reference numerals are used for the components that are substantially the same as those of the first embodiment, and the descrip-tion of repeated components may be omitted.

The metal lines 404B can be any of the metal lines 324, 326, 328, any of the vias 330, 332, 336, or any combination thereof. The metal lines 404B include material that has hardness greater than a hardness of an insulating film including the structures in the crack assist region 208B and the crack stop regions 210B. For example, the crack stop region 210B may be filled with the insulating film 406B.

The metal lines 404B in the crack stop regions 210B are arranged in a checkered pattern in the XY plane, in which the metal lines 404B each have a rectangular cross-section in the XY plane and the metal lines 404B are arranged such that the rectangular cross-sections are staggered both in the directions perpendicular (X direction) to and parallel (Y direction) to the scribe line 110. That is, rectangular regions of the metal lines 404 and rectangular regions of an insu-lating film alternate both in the X direction and the Y direction. The rectangular cross-section of the metal line 404B is sized between about 0.03 μm×0.03 μm and about 1.3 μm×1.3 μm in some examples. The metal lines 404B may each include metal lines 326 and 328, a via 332 connecting the metal lines 326 and 328. This configuration of the metal lines may also reduce about 50% kerf width as compared to the conventional configuration in some examples. Furthermore, due to the arrangement of the metal lines 404B in a checkered pattern, the tensor stress caused by a tape expansion in a stealth dicing can be mitigated in the direction perpendicular (X direction) to and parallel (Y direction) to the scribe line 110 and in the directions that are ±45 degrees off the scribe line 110.

It should be noted that this configuration of the crack stop structures in the crack stop regions 210B is similar to one of commonly used patterns for chemical mechanical polish (CMP) dummy. To mitigate post-CMP planarity issues, dummy fill insertion has become a commonly-used technique. Among many factors that impact dummy fill insertion results are fill shapes are sizes, this checkered feature can mitigate tensile tensor stresses in some applications. At the same time, it can finely adjust the metal density with known dummy fills in some applications.

FIG. 4C is a plan view of a portion 400C of the semiconductor structure 100, including a crack assist region 208C and crack stop regions 210B in the scribe center region 204 extending in the Y direction, in accordance with an embodiment of the present disclosure. The crack assist region 208C may be the same as the crack assist region 208A depicted in FIG. 4A, the crack assist region 208B depicted in FIG. 4B, and may be the crack assist region 208 depicted in FIG. 2. In FIG. 4C, a configuration in which the crack stop regions 210C include metal lines 404C that are arranged differently from the metal lines 404A depicted in FIG. 4A, will be described. The same reference numerals are used for the components that are substantially the same as those of the first embodiment, and the description of repeated components may be omitted.

The metal lines 404C can be any of the metal lines 324, 326, 328, any of the vias 330, 332, 336, or any combination thereof. The metal lines 404C include material that has hardness greater than a hardness of an insulating film including the structures in the crack assist region 208C and the crack stop regions 210C. For example, the crack stop region 210C may be filled with the insulating film 406C.

The metal lines 404C in the crack stop regions 210 C are arranged in an arrow fletch pattern in the XY plane, in which two adjacent metal lines 404C extending in the direction parallel (Y direction) to the scribe line 110 are adjoined by metal line segments 404C' that extend in the directions that are ±45 degrees off the scribe line 110. The metal lines 404B and the metal line segments 404C' may each include metal lines 326 and 328, a via 332 connecting the metal lines 326 and 328. This configuration of the metal lines may also reduce kerf width as compared to the conventional configuration. In some examples, the kerf width may be reduced by approximately 30%. Furthermore, due to the arrangement of the metal lines 404C in an arrow fletch pattern, the tensor stress caused by a tape expansion in a stealth dicing can be mitigated in the direction perpendicular (X direction) to and parallel (Y direction) to the scribe line 110 and in the directions that are ±45 degrees off the scribe line 110.

The crack stop structures in the crack stop regions 404C include only small portions of the metal lines 404 that extend in a direction between the X direction and the Y direction, which may cause higher optical barriers in the existing crack stop features than the metal lines 404 that extend in the X direction or the Y direction. Thus, this crack stop structures in the crack stop regions 404C may provide a high efficiency laser dicing.

FIG. 4D is a plan view of a portion 400D of the semiconductor structure 100, including a crack assist region 208D and crack stop regions 210D in the scribe center region 204 extending in the Y direction, in accordance with an embodiment of the present disclosure. The crack assist region 208D may be the same as the crack assist region 208A depicted in FIG. 4A, the crack assist region 208B depicted in FIG. 4B, the crack assist region 208C depicted in FIG. 4C, and may be the crack assist region 208 depicted in FIG. 2. In FIG. 4D, a configuration in which the crack stop regions 210D include metal lines 404D that are arranged differently from the metal lines 404A depicted in FIG. 4A, will be described. The same reference numerals are used for the components that are substantially the same as those of the first embodiment, and the description of repeated components may be omitted.

The metal lines 404D can be any of the metal lines 324, 326, 328, any of the vias 330, 332, 336, or any combination thereof. The metal lines 404D include material that has hardness greater than a hardness of an insulating film including the structures in the crack assist region 208D and the crack stop regions 210D. For example, the crack stop region 210D may be filled with the insulating film 406D.

The metal lines 404D in the crack stop regions 210D are arranged in a modified checkered pattern in the XY plane, in which the metal lines 404D are arranged in a rectangular array and the metal line segments 404D' each have a rectangular cross-section in the XY plane are arranged such that the rectangular cross-sections are staggered both in the directions perpendicular (X direction) to and parallel (Y direction) to the scribe line 110 within each rectangle in the rectangular array. That is, rectangular regions of the metal lines 404D and rectangular regions 404D' of an insulating film alternate both in the X direction and the Y direction. The rectangular cross-section of the metal line 404D is sized between about 0.03 μm×0.03 μm and about 0.5 μm×0.5 μm in some examples. The metal lines 404D may each include metal lines 326 and 328, a via 332 connecting the metal lines 326 and 328. This configuration of the metal lines may also reduce kerf width as compared to the conventional configuration in some applications. In some applications, the kerf width by approximately 30%. Furthermore, due to the arrangement of the metal lines 404D in a modified checkered pattern, the tensor stress caused by a tape expansion in a stealth dicing can be mitigated in the direction perpendicular (X direction) to and parallel (Y direction) to the scribe line 110 and in the directions that are ±45 degrees off the scribe line 110.

It should be noted that this configuration of the crack stop structures in the crack stop regions 210D is similar to one of commonly used patterns for chemical mechanical polish (CMP) dummy. To mitigate post-CMP planarity issues, dummy fill insertion has become a commonly-used technique. Among many factors that impact dummy fill insertion results are fill shapes are sizes.

In the embodiments described herein, a scribed region in which a crack assist structure and crack stop structures on both sides of the crack assist structure are disposed is provided. The crack assist structure at the center of the scribed region may guide excessive force due to dicing along a scribe line. The excessive force may be guided away from adjacent dies on sides of the scribe region, and may generate cracks along the scribe line away from the adjacent dies. The crack assist structure may collapse to absorb the excessive force, and thus the crack assist structure may prevent the cracks being generated. The crack stop structures on both sides of the crack assist structure in the scribe region may prevent propagating the excessive force to the adjacent dies. As a result, cracks, even if generated by the excessive force, may be prevented from reaching the adjacent dies.

The crack stop structures according the embodiments described herein may reduce heat and vibrations, for example, due to laser stealth in a laser dicing, and tensile stress, for example, caused by a tape expansion, mitigating crack propagations.

Although various embodiments have been disclosed in the present disclosure, it will be understood by those skilled in the art that the scope of the disclosure extends beyond the specifically disclosed embodiments to other alternative embodiments and/or uses and obvious modifications and equivalents thereof. In addition, other modifications which are within the scope of this disclosure will be readily apparent to those of skill in the art based on this disclosure. For example, the BEOL structure 304 depicted in FIGS. 3A and 3B described above include three layers of metal lines (e.g., the metal lines 324, 326 and 328) and two layers of vias between the metal lines (e.g., the vias 330 and 332). However, a number of layers of metal lines and/or vias in a crack assist structure and crack stop structures may not be limited to three and/or two. A crack assist structure and crack stop structures may include more or less layers of metal lines and/or vias. It is also contemplated that various combinations or sub-combinations of the specific features and aspects of the embodiments may be made and still fall within the scope of the disclosure. It should be understood that various features and aspects of the disclosed embodiments can be combined with or substituted for one another in order to form varying embodiments. Thus, it is intended that the scope of at least some of the present disclosure should not be limited by the particular disclosed embodiments described above.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus comprising:
   a scribe region between a first die and a second die adjacent to each other in a first direction, the scribe region comprising a first crack stop region and a second crack stop region extending in a second direction that is perpendicular to the first direction, wherein the first and second dies are to be separated along a scribe line between the first and second crack stop regions;
   a first structure in each of the first and second crack stop regions, the first structure comprising a plurality of first metal lines arranged in a hexagonal array in a plane defined by the first and second directions; and
   a second structure between the first crack stop region and the second crack stop region, the second structure comprising a plurality of second metal lines extending in the second direction, along the scribe line parallel to the first and second crack stop regions to guide a force due to dicing to propagate along the plurality of second metal lines,
   wherein a width of the second structure is greater than a width of a laser beam used in dicing,
   wherein the second structure is configured to collapse to absorb the force due to dicing, and
   wherein the first structure in the first crack stop region and the first structure in the second crack stop region are separated along the scribe line by the second structure.

2. The apparatus of claim 1, wherein the first structure further comprises:

a plurality of vias, wherein each of the plurality of vias connects two of the plurality of first metal lines.

3. The apparatus of claim 1, wherein the plurality of first metal lines comprises copper (Cu) or aluminum (Al).

4. The apparatus of claim 1, wherein each of the plurality of first metal lines has a width of between 0.05 μm and 0.2 μm.

5. The apparatus of claim 1, wherein each hexagon in the hexagonal array has a unit cell length of between 0.1 μm and 3 μm.

6. The apparatus of claim 1, wherein the first structure comprises one or more insulating films encapsulating the plurality of first metal lines.

7. The apparatus of claim 1, wherein the first and second structures are formed on a Si wafer.

8. An apparatus comprising:
   a scribe region between a first die and a second die adjacent to each other in a first direction, the scribe region comprising a first crack stop region and a second crack stop region extending in a second direction that is perpendicular to the first direction, wherein the first and second dies are to be separated along a scribe line between the first and second crack stop regions;
   a first structure in each of the first and second crack stop regions, the first structure comprising a plurality of first metal lines, wherein at least two of metal lines of the plurality of first metal lines are arranged in a direction between the first and second directions in a plane defined by the first and second directions; and
   a second structure between the first crack stop region and the second crack stop region, the second structure comprising a plurality of second metal lines extending in the second direction along the scribe line parallel to the first and second crack stop regions to guide a force due to dicing to propagate along the plurality of second metal lines,
   wherein a width of the second structure is greater than a width of a laser beam used in dicing,
   wherein the second structure is configured to collapse to absorb the force due to dicing, and
   wherein the first structure in the first crack stop region and the first structure in the second crack stop region are separated along the scribe line by the second structure.

9. The apparatus of claim 8, wherein the first structure further comprises
   a plurality of vias, wherein each of the plurality of vias connects two of the plurality of first metal lines.

10. The apparatus of claim 8, wherein the plurality of first metal lines comprise copper (Cu) or aluminum (Al).

11. The apparatus of claim 8, wherein the plurality of first metal lines arranged in a hexagonal array in the plane defined by the first and second directions.

12. The apparatus of claim 8, wherein the plurality of first metal lines comprises metal lines extending in the second direction and metal line segments that extend in directions that are ±45 degrees off the second direction, each metal line segments adjoining two adjacent metal lines.

13. The apparatus of claim 8, wherein the first structure is formed on a Si wafer.

* * * * *